United States Patent
Hazeghi et al.

(10) Patent No.: US 8,704,537 B2
(45) Date of Patent: Apr. 22, 2014

(54) INTEGRATED CAPACITANCE BRIDGE FOR HIGH-RESOLUTION WIDE-TEMPERATURE-RANGE CAPACITANCE MEASUREMENT

(75) Inventors: Arash Hazeghi, San Francisco, CA (US); Joseph A. Sulpizio, Humble, TX (US); David J. K. Goldhaber, Palo Alto, CA (US); H. S. Philip Wong, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 327 days.

(21) Appl. No.: 13/200,701

(22) Filed: Sep. 27, 2011

(65) Prior Publication Data
US 2013/0076378 A1  Mar. 28, 2013

(51) Int. Cl.
*G01R 27/26* (2006.01)

(52) U.S. Cl.
USPC ........................................ 324/680

(58) Field of Classification Search
USPC ............... 324/680, 762.01–762.1; 257/48; 438/14–18
See application file for complete search history.

(56) References Cited

U.S. PATENT DOCUMENTS

| | | | |
|---|---|---|---|
| 4,772,844 A | 9/1988 | Andeen et al. | |
| 5,576,628 A * | 11/1996 | Caliboso et al. | 324/678 |
| 6,194,903 B1 * | 2/2001 | Schulz | 324/661 |
| 6,204,673 B1 | 3/2001 | Andeen et al. | |
| 6,987,391 B2 | 1/2006 | Hagerling et al. | |
| 7,830,695 B1 | 11/2010 | Moon | |

OTHER PUBLICATIONS

Ashoori et al., "Single-Electron Capacitance Spectroscopy of Discrete Quantum Levels", 1992, pp. 3088-3091, Physical Review Letters v68n20.

* cited by examiner

*Primary Examiner* — Tung X Nguyen
(74) *Attorney, Agent, or Firm* — Lumen Patent Firm

(57) ABSTRACT

The present approach is based on the use of an integrated capacitance bridge circuit to measure the capacitance of a device under test. A significant feature of this approach is that the operating point is not the null point of the bridge circuit. Instead, the operating point of the bridge circuit is tuned to be away from the null point. By moving away from the null point, the output signal from the bridge circuit is increased. Preferably, this output signal is substantially larger than the input noise floor of an amplifier connected to the bridge circuit output, while being substantially less than $Gv_{DUT}$, where G is the gain provided by the bridge circuit transistor and $v_{DUT}$ is the AC signal applied to the device under test. Experiments on graphene devices and on carbon nanotube FETs demonstrate about 10 aF resolution (graphene) and about 13 aF resolution (carbon nanotube FET) at room temperature.

15 Claims, 5 Drawing Sheets

INTEGRATED CAPACITANCE BRIDGE FOR HIGH-RESOLUTION WIDE-TEMPERATURE-RANGE CAPACITANCE MEASUREMENT

FEDERALLY-SPONSORED RESEARCH OR DEVELOPMENT

This invention was made with Government support under contract FA9550-08-1-0427 awarded by the Air Force Office of Scientific Research and under contract HR0011-07-3-0002 awarded by the Defense Advanced Research Projects Agency. The Government has certain rights in this invention.

FIELD OF THE INVENTION

This invention relates to capacitance measurement.

BACKGROUND

The increasing interest in nano-scale and quantum devices has led to a correspondingly increased interest in capacitance measurement techniques suitable for such devices. Bridge circuits are often employed for capacitance measurements. If a bridge circuit is connected to a device under test (DUT) with conventional cables, the parasitic capacitance of the cables can overwhelm the capacitance of the device under test if the DUT capacitance is very low, as it often is for nano-scale devices.

An article by Ashoori et al. (Phys. Rev. Lett. v68n20 pp. 3088-3091 1992) describes the integration of a capacitance bridge circuit with the device under test, thereby avoiding the above indicated problem with conventional approaches. In this work, the bridge is tuned to a circuit operating point known as the balance point by adjusting the AC voltage amplitude on a standard capacitor that is part of the bridge circuit, and then measurements are performed. This work was performed at a cryogenic temperature (pumped $^3$He, giving a temperature of <1 K).

It is often desirable to perform sensitive capacitance measurements at more practical temperatures, such as 77K, or more preferably room temperature (i.e., ~300K). Accordingly, it would be an advance in the art to provide high-resolution capacitance measurement techniques suitable for use over a broad temperature range.

SUMMARY

The present approach is based on the use of an integrated capacitance bridge circuit to measure the capacitance of a device under test. A significant feature of this approach is that the operating point is not the balance point of the bridge circuit. Instead, the operating point of the bridge circuit is selected to be away from the balance point. By moving away from the balance point, the output signal from the bridge circuit is increased.

This increase in bridge output signal is highly advantageous for operating over a broad temperature range, because it allows the operating point to be selected such that the bridge output signal is above the input noise floor and the offset voltage of the following amplifier (e.g., a lock-in amplifier) as well as intrinsic thermal drifts in the DUT itself. In contrast, operating at the balance point of the bridge typically leads to situations where the bridge output signal is much smaller than the input noise floor of the following amplifier at practical temperatures, thereby dramatically reducing performance. Since thermal noise increases with temperature, higher temperatures require larger bridge output signals.

Although conventional operation of a bridge circuit entails operating at the balance point, we have found, unexpectedly, that operating away from the balance point does not have significant deleterious effects on performance, provided that the bridge output signal remains sufficiently small, as described in greater detail below.

More specifically, one example of an embodiment of the invention is a method for capacitance measurement where a capacitance bridge circuit is integrated with a device under test (DUT). The integration can be monolithic integration or hybrid integration (bond wire lengths on the order of 1 mm as may occur in hybrid integration do not provide undue parasitic capacitance). The capacitance bridge circuit includes a passive reference element (REF) and a transistor. The REF, the DUT and a gate of the transistor are all connected to a common bridge node. AC signals $v_{REF}$ and $v_{DUT}$ are provided to REF and DUT respectively. Relative phases and/or amplitudes of $v_{REF}$ and $v_{DUT}$ are selected such that the capacitance bridge circuit operates away from a balance point of the bridge circuit.

Several principles for selecting the bridge operating point have been identified in this work. Preferably, relative phases and/or amplitudes of $v_{REF}$ and $v_{DUT}$ are selected such that an output signal from the bridge circuit transistor is substantially greater (e.g., >10× noise floor) than an input noise floor of an amplifier connected to an output of the transistor. For convenience, we use the term "noise floor" to refer to the total input referred noise at the amplifier input. Thus, this noise floor includes the amplifier noise as well as sources of noise other than the amplifier (e.g., the HEMT transistor, thermal drift, etc.). It is also preferred that relative phases and/or amplitudes of $v_{REF}$ and $v_{DUT}$ be selected such that an output signal from the bridge circuit transistor is substantially less (e.g., <0.1 $Gv_{DUT}$) than a product of G and $v_{DUT}$, where G is the gain provided by the transistor. In one example, application of these principles leads to a preferred range for the transistor output signal between about 100 nV and about 500 nV In practice, the transistor of an integrated bridge circuit need not provide high gain, since the output of the transistor is typically connected to a high-gain amplifier, such as a lock-in amplifier. Thus, the transistor acts more as an impedance matching element than as an amplifier. Accordingly, it is preferred for the transistor gain to be substantially less than one (e.g., voltage gain <0.1), where the noise performance is typically better than at higher gains. In practice, the HEMT gain can be set by operating the bridge without a DUT present, and adjusting the HEMT gate bias to maximize the bridge output SNR. Such optimization of the HEMT gain is temperature dependent, so the SNR is optimized at a predetermined temperature (i.e., the temperature at which the bridge will be operated to characterize the DUT).

As indicated above, the present approach can provide capacitance measurements over a broad range of temperatures, such as 77K to 300K, 4K to 300K etc. Preferably, the transistor of the bridge circuit is a high electron mobility transistor capable of operating over a range of at least 4K to 300K, to provide flexibility. Silicon transistors are typically unsuitable for use as the bridge circuit transistor because of carrier freeze-out at low temperatures, and because of their poor noise performance. Matching the thermal expansion coefficients is often important. In cases where the bridge circuit is disposed on a substrate, it is preferred for the bridge circuit transistor and the substrate to have matched thermal expansion coefficients.

It is often important to ensure that a capacitance measurement does not unduly disturb the device under test. Accordingly, it is preferred for the amplitude of $v_{DUT}$ to be less than or about equal to a characteristic thermal voltage corresponding to a temperature at which the capacitance measurement is performed (i.e., $k_B T/q$, where q is the carrier charge, T is the measurement temperature, and $k_B$ is Boltzmann's constant).

As indicated above, the output of the bridge circuit (i.e., the output voltage of the bridge circuit transistor) is often provided to a lock-in amplifier. In such cases, it is preferred that the output voltage from the bridge circuit transistor be larger than the sum of a thermal noise voltage, the drift in the bridge circuit, and the input offset voltage of the lock-in amplifier (i.e., larger than the input noise floor of the lock-in amplifier). Instruments other than, but similar to, a lock-in amplifier can also be used to amplify the output signal from the bridge circuit.

Preferably, the passive reference element includes a thin film resistor having a parasitic capacitance of less than 250 fF. Transformer coupling of the AC signals to the DUT and reference element is preferred. Such transformers preferably have low noise and low loss.

DETAILED DESCRIPTION

I. Introduction

As device scaling continues below 20 nm and novel nanodevices appear on the horizon, accurate characterization and detailed understanding of their electronic structure is essential, yet challenging. For example, carrier transport through a nanostructure, which is often quantified by mobility, cannot be accurately characterized from conductance alone without knowing the exact carrier density. Information on carrier density is often extracted from a capacitance spectrum by measuring the capacitance between the device channel and a gating terminal as a function of DC bias, commonly known as a capacitance-voltage (CV) curve.

In most field-effect semiconductor devices, a dielectric layer isolates the channel from the gate electrode. The capacitance measured from the gate is the series combination of the geometric capacitance associated with the dielectric, $C_{ox}$, and the capacitance associated with adding carriers to the band structure of the semiconductor, or the quantum capacitance, $C_Q$, which is proportional to the electronic density of states (DOS). For devices with large DOS in the channel, the effective gate capacitance is simply the geometric capacitance $C_{ox}$. However, in nanoscale devices with strongly coupled gates, a low DOS in the channel can reduce the quantum capacitance to hundreds of attofarads, making $C_Q$ dominate the total gate capacitance. In this regime, the total capacitance is a strong function of the channel DOS. In order to fully resolve fine band structure features, for example, van Hove singularities in carbon nanotubes, an external excitation smaller than the characteristic thermal voltage $k_B T/q$ is necessary.

Figure 1A:
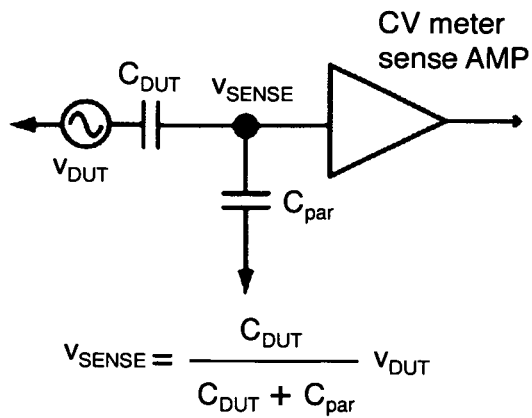
FIGS. 1a-b show circuit diagrams relating to capacitance measurement.

Macroscopic capacitances are typically measured in a bridge circuit configuration, where the signals across the device under test (DUT) and a reference impedance are balanced using a feedback loop. Such measurement setups inevitably include some length of cables that have a significant parasitic capacitance on the order of hundreds of picofarads. This produces an enormous attenuation of the test signal, pushing even state-of-the-art laboratory CV meters beyond their resolution limits when the requisite small test signals are used, as illustrated in FIG. 1a. For small $C_{DUT}$, the test signal is attenuated by a factor of $\sim C_{DUT}/C_{par}$, which is on the order of $10^6$ for typical nanostructures connected via standard coaxial cables.

In this work, we aim not to provide yet another method for precisely measuring a macroscopic capacitance. Instead our goal is to enable measurement of the quantum capacitance of a nanostructure, while maintaining a smaller-than-$k_B T/q$ excitation over a wide temperature range to avoid smearing quantum capacitance features. CV measurements with the necessary attofarad resolution have been previously performed on nanostructures using commercial LCR meters. However, these measurements generally use large excitation (>100 mV) and require a very long averaging time (more than a few thousand samples per point), and are therefore prone to thermal and environmental drifts in the sample as well as the measurement setup.

We present an integrated capacitance bridge to extract and balance the test signal coming from a nanostructure before it is attenuated by external cables. We demonstrate excellent capacitance resolution for test signals less than $k_B T/q$ from room temperature down to temperatures of 4 K, yielding an output noise of less than 10 nV/√Hz. As a practical implementation of our integrated bridge, we measure the capacitance of top-gated graphene devices and carbon nanotube FETs.

II. Bridge Design and Operation

The bridge circuit includes a reference impedance and an impedance-matching amplifier, whose function is to drive the large parasitic cable capacitance and isolate the DUT. Since we are interested in measurements across a broad temperature range down to cryogenic temperatures, we use a GaAs-based high electron mobility transistor (HEMT) as the impedance-matching amplifier. A standard Si FET is unsuitable due to carrier freeze-out at low temperature. The HEMT in our bridge is an unpackaged FHX35X transistor manufactured by the Fujitsu Corp., and has a wide (~280 µm) channel fabricated from epitaxially-grown GaAs, with a gate capacitance ~0.4 pF. Several other commercially available HEMTs, including the Agilent ATF 33143 and 34143, were found to be unsuitable in our measurements due to high-frequency (MHz) transport resonances. At the measurement frequency of 17.5 kHz, gate leakage is minimal, and the gate impedance is dominated by this capacitance ($Z_{gate}$~23 MΩ). The 2D electron gas is fully depleted when the gate is biased at −1 V (depletion mode).

Figure 1B:
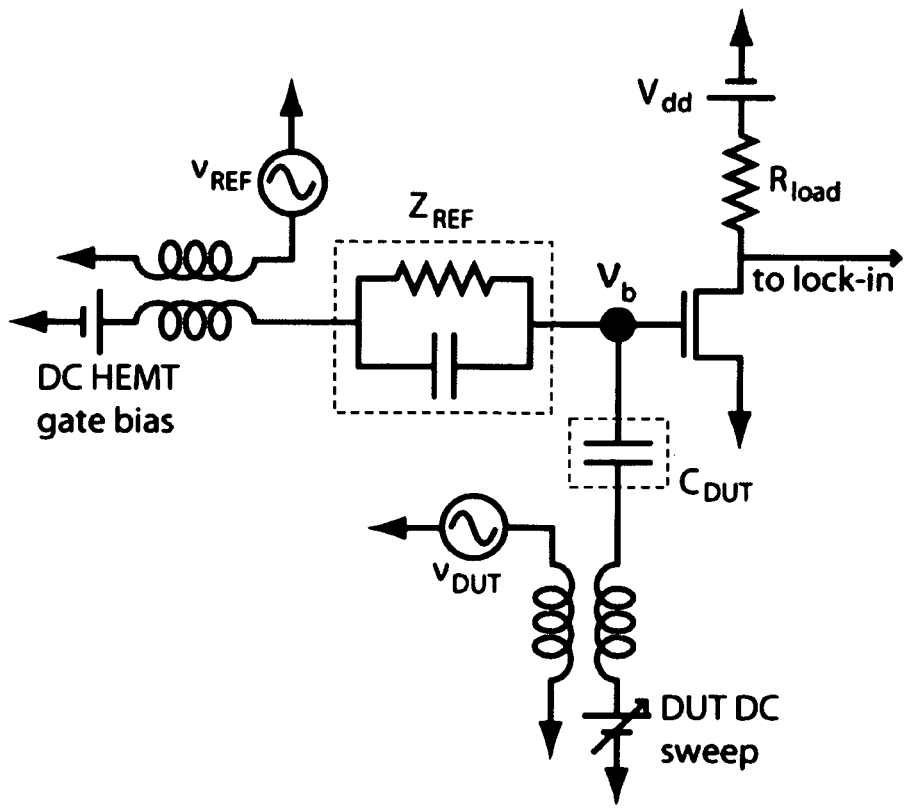

The reference impedance is used to balance the signal across the DUT, and its AC impedance should be chosen to be larger than the HEMT gate AC impedance to prevent additional shunting of the DUT signal. As the HEMT gate is DC biased through the reference (via a Yokogawa 7651 programmable low-noise DC power supply), the reference DC impedance should ideally be at most of the same order as the HEMT gate resistance at all temperatures. To satisfy these constraints at the test frequency 17.5 kHz, we use a 500 MΩ thin-film resistor (Tyco Electronics part no. 26M2248) with a low thermal coefficient and a parasitic capacitance $C_{REF}$~110 fF. A 1 kΩ load resistor (Vishay Dale no. CCF551K00FKE36) is used to bias the HEMT drain. A bridge schematic is shown in FIG. 1b. AC and DC signals are added together with Triad Magnetics SP-67 audio transformers.

To avoid strain and thermal gradients at low temperature, a thermally matched substrate is employed to mount the bridge circuit. We used a semi-insulating GaAs wafer as the substrate, onto which a 23 nm $Al_2O_3$ layer was grown via atomic layer deposition for the additional electrical isolation. Standard photolithography/liftoff processing was used to fabricate 300 nm thick Al electrodes for bonding. The bridge components were then attached to the substrate, using thermally conductive silver epoxy for the HEMT and PMMA for the reference resistor, then wirebonded to the pads.

In operation, two out-of-phase AC signals, $v_{DUT}$ and $v_{REF}$, at the same frequency, are simultaneously applied to the DUT and reference resistor, respectively. The signal $v_b$ at the so-called "bridge point" [FIG. 1b] is an average of voltages at nearby circuit nodes, weighted by the admittances of these nodes to the bridge point $$v_b = \frac{Y_{DUT}}{Y_\Sigma} v_{DUT} + \frac{Y_{REF}}{Y_\Sigma} v_{REF} \quad (1)$$

where Y refers to the AC admittance and $Y_\Sigma = Y_{DUT} + Y_{REF} + Y_{par}$ is the total admittance seen from the bridge point. The "par" subscript refers to parasitic terms, including the HEMT gate impedance. When balanced, i.e., $v_b = 0$, the amplitude and phase of the DUT impedance are given by $$Z_{DUT} = \frac{-v_{DUT}}{Y_{REF} \times v_{REF}} \quad (2)$$

independent of any parasitic capacitances. For a measurement of $C_{DUT}$ as a function of DUT DC gate voltage, the other circuit admittances in Eq. (1) need only be characterized once, as other than $C_{DUT}$ they do not change with the gate voltage sweep (see Sec. III for details).

Figure 2:
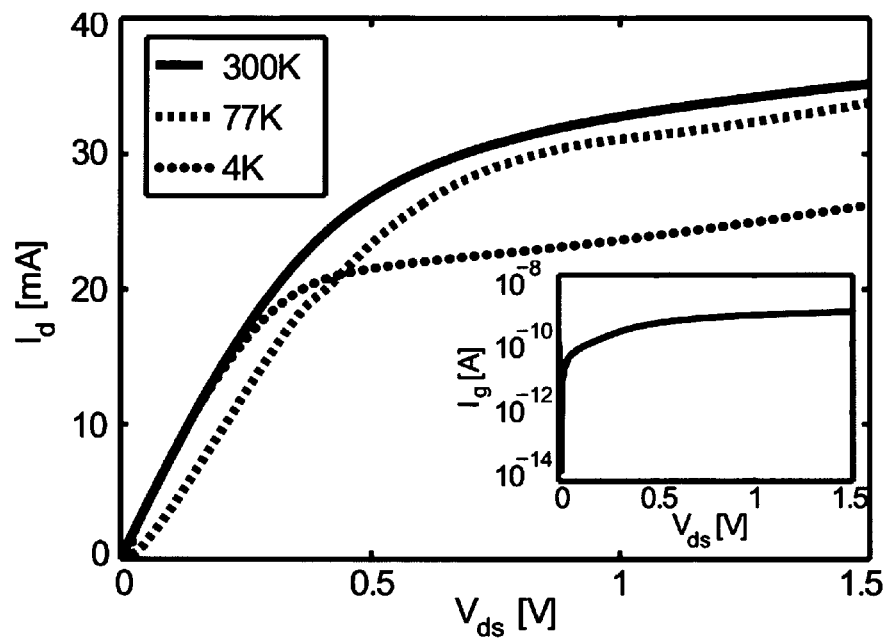
FIG. 2 shows output characteristics of a HEMT that was used in experiments relating to an embodiment of the invention.

Output characteristics and gate leakage (below 1 nA) of the HEMT are shown in FIG. 2. The gate leakage was measured via an Agilent B1500A parameter analyzer and Keithley 2612. The inset shows the gate current $I_g$ as a function of $V_{ds}$ for $V_{gs} = 0$ (no load resistor). For temperatures 77K and below, the leakage is below 1 pA. The bias point for the HEMT is chosen to maximize signal-to-noise ratio (SNR) while keeping the DC power as low as possible to avoid thermal drift and temperature gradients during measurement. All measurements were performed in the dark to prevent optical excitation of the exposed 2DEG in the HEMT. After cooling, HEMTs were temporarily exposed to light, to enable navigating probes to pads, so persistent photoconductivity may affect HEMT characteristics at 77 K and 4 K.

Figures 3A, 3B:
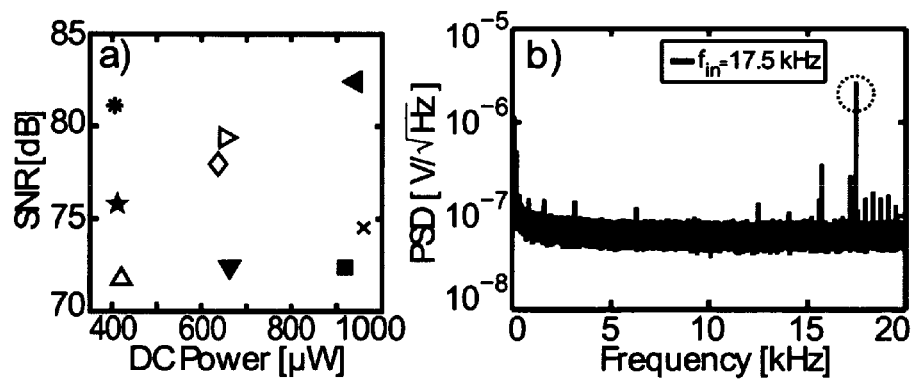
FIG. 3a shows SNR and power dissipation of the experimental HEMT at various bias points.
FIG. 3b shows the bridge output power spectral density at an optimized HEMT bias point.

We found that the optimal bias point for the HEMT is in the triode regime, which has low gain—even below 1 (Table 1)—but also has very low noise and thermal drift, and thus maximal SNR. The low HEMT gain is not detrimental here, as it is compensated for by the high gain of the lock-in amplifier sampling the HEMT output. Thus, the HEMT functions primarily as an impedance-matching circuit element between the DUT impedance and the line impedance. FIG. 3a shows SNR and DC power dissipation for the HEMT for various $V_{gs}$ and $V_{dd}$ pairs applied to the 1 kΩ load resistor $R_{load}$. FIG. 3b shows the output power spectrum for the optimal bias point at room temperature for an RMS input AC excitation of 1.5 mV at 17.5 kHz. The spectrum is flat except for low frequencies (below 1 kHz), where 1/f noise dominates. We use a Stanford Research Systems lock-in amplifier (model SR830) to recover the small AC output of the amplifier. We define the output sensitivity S by $S = \Delta n \Leftrightarrow \sqrt{t_{meas}}$, where $\Delta n$ is the RMS noise in the measured data points sampled with the lock-in, and $t_{meas}$ is the lock-in measurement time per data point. The measurement time $t_{meas}$ is proportional to the lock-in time constant and filter slope (Stanford Research Systems SRS830 Manual). At each temperature, we perform a HEMT bias optimization prior to the capacitance measurement. The optimal bias points with corresponding output sensitivity S for a range of temperatures are given in Table 1 below. At optimal bias conditions, amplifier transconductance $g_m E$ Gain/$R_{load}$~50 μS. The sensitivity improves only slightly as temperature decreases, because the bridge performance is mainly limited by 1/f noise from the HEMT.

TABLE 1

Optimized HEMT bias conditions with corresponding amplifier output sensitivity S and best achievable capacitance resolution per root Hz $\delta\tilde{C}$.

| T (K) | $V_{dd}$ (V) | $V_{gs}$ (mV) | S (nV/√Hz) | HEMT gain ($v_{out}/v_b$) | $\delta\tilde{C}$ (aF/√Hz) |
|---|---|---|---|---|---|
| 300 | 4 | −50 | 8 | 0.047 | 60 |
| 77 | 4 | −50 | 7.4 | 0.063 | 59 |
| 4.2 | 4 | −25 | 5.6 | 0.099 | 21 |

In order to obtain a C-V spectrum for the DUT, e.g. as a function of its DC gate bias, the capacitance needs to be measured continuously as the DUT gate bias is swept within the range of interest. However, since all the integrated capacitance bridge (ICB) impedances are linear with the small-amplitude AC signals used, it is not necessary to tune the ICB for every DUT gate bias value. We can extract the DUT capacitance ($Y_{DUT}$), directly from the ICB output signal ($v_{out}$), as the DUT gate bias is swept, using the equation below. This will make the measurements considerably faster:

$$v_{out} = Gv_b = G \left\{ \frac{Y_{REF} v_{REF} + Y_{DUT} v_{DUT}}{Y_{REF} + Y_{par} + Y_{DUT}} \right\} \rightarrow Y_{DUT} = \quad (3)$$

$$j\omega C_{DUT} = \frac{GY_{REF} v_{REF} - v_{out}(Y_{REF} + Y_{par})}{v_{out} - Gv_{DUT}}$$

where G is the AC gain of the HEMT and $v_{out} = Gv_b$. The error or noise in the extracted capacitance $\delta\tilde{C}$ is therefore:

$$\delta\tilde{C} = \left| \frac{\partial C_{DUT}}{\partial v_{out}} \right| \sqrt{\sigma_{v_{out}}^2} = \omega \left| \frac{Y_{REF} + Y_{par} + Y_{DUT}}{v_{out} - Gv_{DUT}} \right| \sqrt{\sigma_{v_{out}}^2} \quad (4)$$

Given that output-referred noise does not change with output signal amplitude, in order to minimize $\delta\tilde{C}$, the ICB is preferably tuned such that either, $v_{out} \ll Gv_{DUT}$ or $v_{out} \gg Gv_{DUT}$.

Since $Gv_{DUT}$~10-450 μV r.m.s for T=4K-300K, the latter case is not ideal because it will increase the AC power dissipation in the HEMT, causing thermal drift and instability, especially at lower T. Therefore, for actual C-V sweeps, we tune the ICB such that $v_{out}$ stays at least an order of magnitude larger than the noise floor of the lock-in amplifier (~5-10 nV for our setup) while being at least an order of magnitude lower than $Gv_{DUT}$ to minimize $\delta\tilde{C}$. In practice we kept the output signal around 100-500 nV for the quantum capacitance measurements in the following sections. The values extracted for $\delta\tilde{C}$ from Eq. 4 are shown in the last column of Table 1 for a fixed $v_{DUT}$=10 mV r.m.s and a 250 aF $C_{DUT}$.

III. Experimental Setup and Measurements

To demonstrate a practical application of our bridge, we measure the capacitance of graphene with a strongly coupled top gate. The graphene in our device was deposited on a $SiO_2$/Si chip via mechanical exfoliation, and confirmed to be single layer via optical contrast and confocal Raman spectroscopy. One hundred nanometer of PMMA was spin-coated, and source/drain leads to a selected graphene sheet were defined with e-beam lithography. Following Ti/Au deposition (5/40 nm, respectively) and liftoff in acetone, the entire chip surface was coated via e-beam evaporation with nominally 1.5 nm of Al, which then oxidized almost immediately upon exposure to air. A top-gate electrode was patterned on top of the graphene by e-beam lithography, followed by 40 nm of e-beam evaporation of Al and liftoff in acetone. The active device area beneath the top gate was 14.85 μm². The graphene device chip was finally wirebonded to the bridge chip, and both chips were mounted on a copper support for thermal anchoring.

Figure 4:
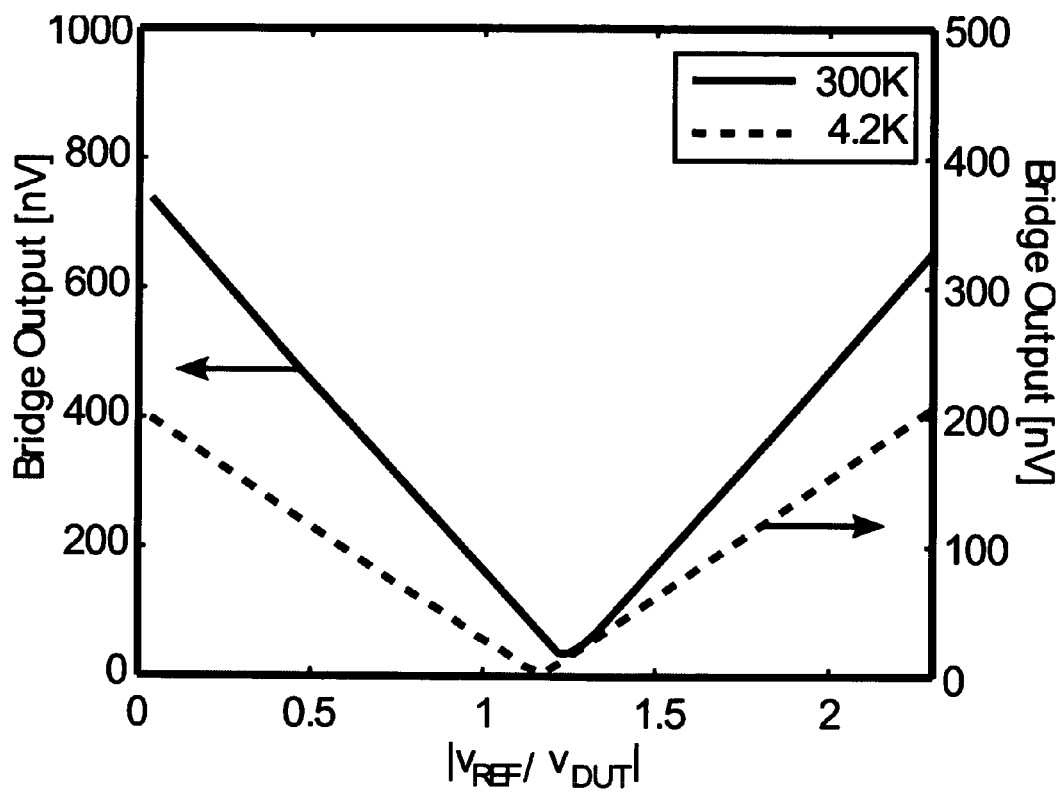
FIG. 4 shows bridge tuning curves at two different temperatures.

Measurements were carried out in a Lakeshore/Desert Cryogenics variable temperature probe station. The HEMT gate impedance $Z_{gate}$ was characterized by measuring the difference in HEMT response between exciting the HEMT gate directly through its small bond pad and exciting the gate through the reference impedance. The signal attenuation G is then related to the impedances by the equation $G=Z_{gate}/(Z_{gate}+Z_{REF})$. These complex impedance values are used to calculate the relative phase between $v_{REF}$ and $v_{DUT}$ required for balancing the bridge. Bridge balance curves are shown in FIG. 4. For the 300K curve, $v_{DUT}$=8 mV and $\Delta\Phi$=144°. For the 4.2 K curve, $v_{DUT}$=100 μV and $\Delta\Phi$=155°. Here $\Delta\Phi$ is the phase difference between $v_{DUT}$ and $v_{REF}$. The bridge output minimum and phase difference MI are shifted slightly between the two curves due to changes in the REF and DUT impedances with temperature.

The circuit is initially tuned as described above to an off-balance point at the onset of a CV measurement. The change in capacitance of the graphene as the top-gate DC bias is swept is then calculated from the deviation of the bridge signal $v_b$ away from the balance point using Eq. (1). Since the DC DUT impedance (graphene gate impedance) is much larger (TΩ) than the other DC circuit impedances, the DC HEMT gate bias does not vary during the CV measurement as the graphene DC gate bias is swept. The measured capacitance change is therefore attributable to the graphene device quantum capacitance.

Capacitance from bond pads, wirebonds, and probe tips contribute to the DUT shunt capacitance, which is in parallel with $C_{DUT}$ and sets a constant baseline for the measurement. We estimate this shunt capacitance to be no more than 10 fF, based on capacitance measurements with the integrated bridge of semiconducting nanotubes with similar device layout. This is roughly 10% of the measured capacitance (FIG. 5), so though a strength of our technique is in measuring changes in capacitance with gate voltage, we can also obtain capacitance per unit area to 10% accuracy. Our extracted value for geometric capacitance (capacitance far from the Dirac point) is ~7.5 fF/μm², consistent with dielectric thickness ~10 nm and dielectric constant ~8. These are plausible values for our oxidized Al dielectric, though we do not have precise independent measures of the dielectric parameters.

We define the measurement sensitivity $S_{meas}\equiv|\partial v_b/\partial Y_{DUT}|$, so that we have for the measurement resolution of $C_{DUT}$:

$$\delta C_{DUT} \sim \delta Y_{DUT} = \frac{1}{S_{meas}} \delta v_b \quad (5)$$

The signal-to-noise ratio (SNR) is related to the measurement sensitivity by SNR=$S_{meas}(Y_{DUT}/v_b)$. Evaluating the derivative in Eq. (5) using Eq. (1), we find the expression for the sensitivity $$S_{meas} = \left|\frac{(v_{DUT}-v_{REF})Y_{REF}+v_{DUT}Y_{par}}{(Y_{DUT}+Y_{REF}+Y_{par})^2}\right| \quad (6)$$

Thus, the measurement sensitivity is maximized by increasing $v_{DUT}$. However, in practice, we limit this excitation to $v_{DUT}$~$k_S T/q$ to avoid blurring of density-of-states features by our excitation as described above. This also prevents significant thermal drift and heating. For measuring small capacitances associated with nanostructures, the voltage $v_{REF}$ applied to the reference impedance typically needs to be much smaller than the voltage $v_{DUT}$ applied to the DUT to balance the bridge, which ensures that $v_{REF}$ is kept below $k_B T/q$.

IV. Results and Discussion

Two-dimensional graphene has no energy gap between the conduction and valence bands. Instead, these bands meet at a point, termed the Dirac point, about which the energy-momentum dispersion is linear. The density of states and associated quantum capacitance $C_Q$ therefore vary linearly with energy near the Dirac point. As the top-gate bias voltage is swept, the Fermi level scans the graphene energy spectrum, passing through the Dirac point, where the capacitance reaches a minimum. The minimum capacitance is limited by the temperature, disorder, and DUT parallel shunt capacitances. For top-gate voltages that tune the Fermi level far in energy from the Dirac point, the density of states and associated $C_Q$ are large, so that $C_{ox}$ will dominate.

Figure 5A:
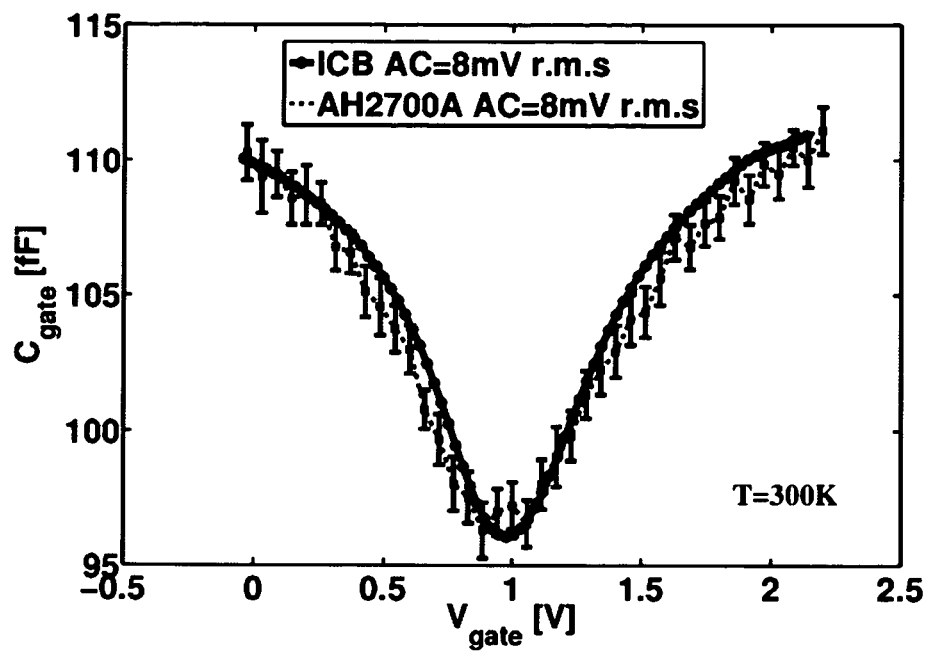
FIGS. 5a-b show measured CV curves for a top-gated graphene device compared to results from a commercial CV meter.
Figure 5B:
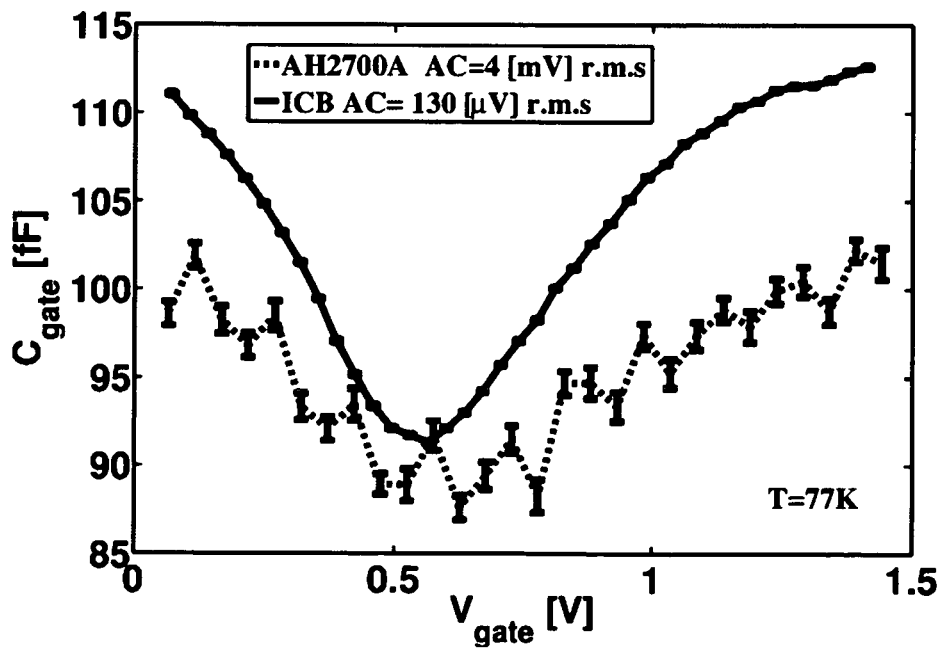

FIGS. 5a-b (solid lines) show graphene capacitance measurements for our integrated bridge at both room temperature (FIGS. 5a) and 77 K (FIG. 5b). The measurements were acquired with the lock-in low pass filter set to 24 dB/octave rolloff and a 3 s time constant, corresponding to 38.4 s of acquisition per data point. At room temperature, using an AC excitation of 8 mV for $v_{DUT}$, the overall capacitance curve matches the trend expected for a quantum capacitance proportional to the density of states of graphene (measured resolution $\delta C$~11 aF), and agrees with existing graphene capacitance measurements in the literature. The capacitance is symmetric about the Dirac point, which occurs at a top-gate voltage $V_q$~0.5 V. At 77 K, a substantially lower excitation of 130 μV was used for $v_{DUT}$ (peak-to-peak amplitude ~1/18

$k_B T/q$). The capacitance curve is again cleanly resolved (measured resolution $\delta C \sim 53$ aF), with improvement in the sharpness of the capacitance around the Dirac point due to lower temperature and excitation (depth of Dirac point capacitance dip $\Delta C$ increased from ~15 to ~21 fF).

Upon direct comparison with a commercial ultraprecision capacitance bridge using comparable data acquisition time (dotted lines on FIGS. 5a-b), the resolution of our integrated bridge exceeded the resolution of the commercial tool by several orders of magnitude. Comparative measurements were made on the same graphene device using the Andeen-Hagerling AH2700A Ultra-precision Capacitance/Loss Bridge. To avoid perturbing the DUT, the integrated bridge was left bonded up for these measurements. However, it was powered down, and probes driven by the AH2700A directly contacted pads attached to the graphene and its gate, bypassing the integrated bridge circuitry and isolating the capacitance of the graphene device. The shunt capacitance of the integrated bridge (~10 fF) should have no effect on the noise in the AH2700A's capacitance measurements-indeed, the AH2700A performed to its manufacturer's specifications for noise.

V. Second Experiment—Carbon Nanotube Fet (Cnfet)

In a second example, we measure the gate capacitance for a top-gated CNFET device having a single carbon nanotube, to demonstrate the atto-farad resolution of the ICB. The CNFET devices were fabricated with E-beam lithography for source/drain (S/D) fingers as well as for the top-gate. The top-gate dielectric was alumina deposited by 110 cycles of ALD at 110° C. corresponding to a thickness of ~105 Å. The top gate metal was ~400 Å Al. After conductance measurements, the CNFET chip was cleaved such that the device was very close to the edge. After spreading viscous PMMA on the edge, the chip was mounted side-by-side with the ICB on the copper substrate. The S/D pad was then wire-bonded to the ICB. The heavily doped ($N > 10^{19}$ cm$^{-3}$) P$^{++}$ Si acts as a back gate for the structure. To make contacts to the back-gate we scratched the SiO$_2$ layer (~3000 Å) using a sharp scriber and evaporated ~500 Å of gold through a shadow mask. The gold was then bonded to a macroscopic pad made of a piece of thin copper tape, to which the center line of a miniature coax wire was soldered.

The sample is placed in the Lakeshore cryostat for the C-V measurements. The structure has both a top gate and a back gate. The top gate is used to apply the AC excitation, $v_{DUT}$ and the back-gate is used for DC-sweeping. The regions between the S/D electrodes and the top gate are only controlled by the back gate. These regions are highly resistive (OFF) for positive back-gate bias, therefore the OFF capacitance measurement, $C_{OFF}$, only yields the parasitic capacitance. The parasitic capacitance is mostly due to the fringe capacitance between the S/D wire-bond and the probe tip that is touching the top-gate pad. The S/D pad and the top gate pad were fabricated 580 μm away from each other. We used the smallest available probe tips from LakeShore, model 03ZnBe (3 μm-tip zinc-beryllium) probes. The parasitic capacitance was about ~850 aF which is larger than the CNFET capacitance. It is possible to lower this parasitic capacitance to ~40 aF by using a carefully-placed large copper shield between the top-gate probe and the S/D wire-bond. However since the LakeShore FWP6 system was configured with four manipulators only, this was not possible, as all the probes were in use (we need four probes to contact the REF, HEMT source, HEMT drain and CNFET top gate). Nevertheless, the parasitic capacitance was not detrimental to measurement results. Once a large negative voltage is applied to the back gate that is coupled to the channel through the thick SiO$_2$ layer, the exposed carbon nanotube (CNT) regions will turn ON, connecting the 3 μm-wide region under the top-gate to S/D electrodes.

Figure 6:
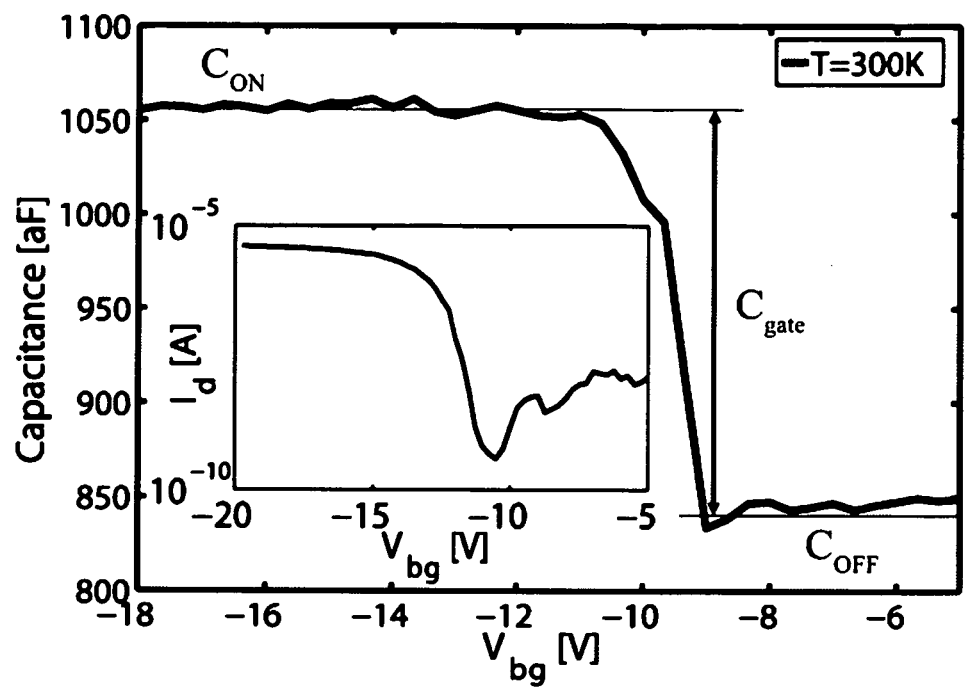
FIG. 6 shows measured capacitance data from a carbon nanotube FET having a single carbon nanotube.

The capacitance reading $C_{ON}$ will therefore include the top-gate capacitance plus the parasitics, so by subtracting these two readings we can extract the gate capacitance, $C_{gate} = C_{ON} - C_{OFF}$. FIG. 6 shows the capacitance reading as a function of the back-gate DC bias, $V_{bg}$ at T=300K. The total top-gate capacitance $C_{gate}$ is ~250 aF for the 3 μm-long channel. The inset on FIG. 6 shows a plot of $I_d$ vs. $V_{bg}$ for the same device, confirming p-type conduction. Data was collected using an AC excitation $v_{DUT}$=15 mV r.m.s, and a lock-in time constant of 3 seconds. For 40 bias points, the total measurement time was less than an hour. The resolution for capacitance readings is ~13 aF. The resolution for the AH2700A in similar conditions would be 675 aF×8 mV/15 mV=360 aF, so this measurement will not be possible with the AH2700A, unless the measurement time is increased by a factor of (360/13)$^2$~768, or about a month of measurement for the 40-point sweep.

VI. Conclusions

We have demonstrated a reliable method for integrated high-resolution quantum capacitance measurements over a wide temperature range using an integrated bridge circuit directly wirebonded to the DUT. The performance of our bridge was tested by measuring the capacitance of a top-gated graphene device and by measuring capacitance in a CNFET, illustrating directly how the integrated bridge enables the fast measurement of quantum capacitance for nanostructures down to cryogenic temperatures, and achieves tens of attofarad resolution per root hertz at room temperature (equivalently, ~4 e$^-$ per root hertz on the DUT) while limiting the excitation amplitude to below $k_B T/q$.

The invention claimed is:

1. A method for capacitance measurement of a device under test (DUT), the method comprising:
   providing a capacitance bridge circuit connected to and integrated with the DUT, wherein the capacitance bridge circuit includes a passive reference element (REF) and a transistor having a gain G, and wherein the REF, the DUT and a gate of the transistor are all connected to a common bridge node;
   providing a first AC signal $v_{REF}$ to the passive reference element;
   providing a second AC signal $v_{DUT}$ to the device under test;
   wherein relative phases of $v_{REF}$ and $v_{DUT}$ are selected such that the capacitance bridge circuit operates away from a balance point of the bridge circuit.

2. The method of claim 1, wherein relative phases and/or amplitudes of $v_{REF}$ and $v_{DUT}$ are selected such that an output signal from the transistor is between about 100 nV and about 500 nV.

3. The method of claim 1, wherein relative phases and/or amplitudes of $v_{REF}$ and $v_{DUT}$ are selected such that an output signal from the transistor is substantially greater than an input referred noise of an amplifier connected to an output of the transistor.

4. The method of claim 1, wherein relative phases and/or amplitudes of $v_{REF}$ and $v_{DUT}$ are selected such that an output signal from the transistor is substantially less than a product of G and $v_{DUT}$.

5. The method of claim 1, wherein G is substantially less than one.

6. The method of claim 1, wherein G is selected to maximize a signal to noise ratio provided by the bridge circuit at a predetermined temperature.

7. The method of claim 1, wherein the capacitance measurement is performed at a temperature between about 4K and about 300K.

8. The method of claim 1, wherein the transistor is a high electron mobility transistor capable of operating over a temperature range of at least 4K to 300K.

9. The method of claim 1, wherein the bridge circuit is disposed on a substrate, and wherein the transistor and the substrate have matched thermal expansion coefficients.

10. The method of claim 1, wherein an amplitude of the second AC signal $v_{DUT}$ is selected to be less than or about equal to a characteristic thermal voltage corresponding to a temperature at which the capacitance measurement is performed.

11. The method of claim 1, further comprising using a lock-in amplifier to measure an output voltage of the transistor.

12. The method of claim 11, wherein an output voltage from the transistor is larger than a sum of a thermal noise voltage, a drift in the bridge circuit, and an input offset voltage of the lock-in amplifier.

13. The method of claim 1, wherein the passive reference element comprises a thin film resistor having a parasitic capacitance of less than 250 fF.

14. The method of claim 1, wherein the first AC signal is coupled to the passive reference element via a first transformer.

15. The method of claim 1, wherein the second AC signal is coupled to the device under test via a second transformer.

* * * * *